(12) United States Patent
Miyauchi

(10) Patent No.: US 6,639,843 B2
(45) Date of Patent: Oct. 28, 2003

(54) SEMICONDUCTOR MEMORY DEVICE WITH BLOCK-UNIT ERASE TYPE NONVOLATILE MEMORY

(75) Inventor: Sigenori Miyauchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/207,379

(22) Filed: Jul. 30, 2002

(65) Prior Publication Data

US 2003/0043634 A1 Mar. 6, 2003

(30) Foreign Application Priority Data

Aug. 31, 2001 (JP) ........................................ 2001-263748

(51) Int. Cl.⁷ .............................................. G11C 16/04
(52) U.S. Cl. .............................. 365/185.29; 365/185.11; 365/230.03
(58) Field of Search ....................... 365/185.29, 185.09, 365/185.33, 185.11, 230.01, 230.03; 711/103

(56) References Cited

U.S. PATENT DOCUMENTS

| | | | |
|---|---|---|---|
| 5,627,783 A | 5/1997 | Miyauchi | 365/185.33 |
| 5,841,699 A * | 11/1998 | Miyauchi | 365/185.33 |
| 5,946,714 A | 8/1999 | Miyauchi | 711/205 |
| 5,963,983 A | 10/1999 | Sakakura et al. | 711/202 |
| 6,034,897 A * | 3/2000 | Estakhri et al. | 365/185.33 |
| 6,058,047 A * | 5/2000 | Kikuchi | 365/185.33 |
| 6,388,919 B2 * | 5/2002 | Terasaki | 365/185.09 |
| 2002/0069314 A1 | 6/2002 | Miyauchi | 711/103 |

FOREIGN PATENT DOCUMENTS

| | | |
|---|---|---|
| JP | 8-212019 | 8/1996 |
| JP | 9-185551 | 7/1997 |
| JP | 9-282111 | 10/1997 |
| JP | 10-124381 | 5/1998 |

* cited by examiner

Primary Examiner—Anh Phung
(74) Attorney, Agent, or Firm—McDermott, Will & Emery

(57) ABSTRACT

A CPU calculates a logical block number (LBN) based on a logical sector address (LSA) given by a host and converts the logical block number into a physical address (PBN) of a nonvolatile memory using an address conversion table. Pieces of address conversion table information are dispersively stored in erase blocks (30), and logical block numbers are read from the erase blocks in a power-on state to create the address conversion table on a RAM. When writing data from the host, the data is written in a vacant erase block, and an address of the used vacant erase block is stored by a CPU.

3 Claims, 6 Drawing Sheets

ADDRESS CONVERSION TABLE

| | |
|---|---|
| . | . |
| . | . |
| . | . |
| Offset2 | ERASE BLOCK PBN2←LBN2 |
| Offset1 | ERASE BLOCK PBN1←LBN1 |
| Offset0 | ERASE BLOCK PBN0←LBN0 |

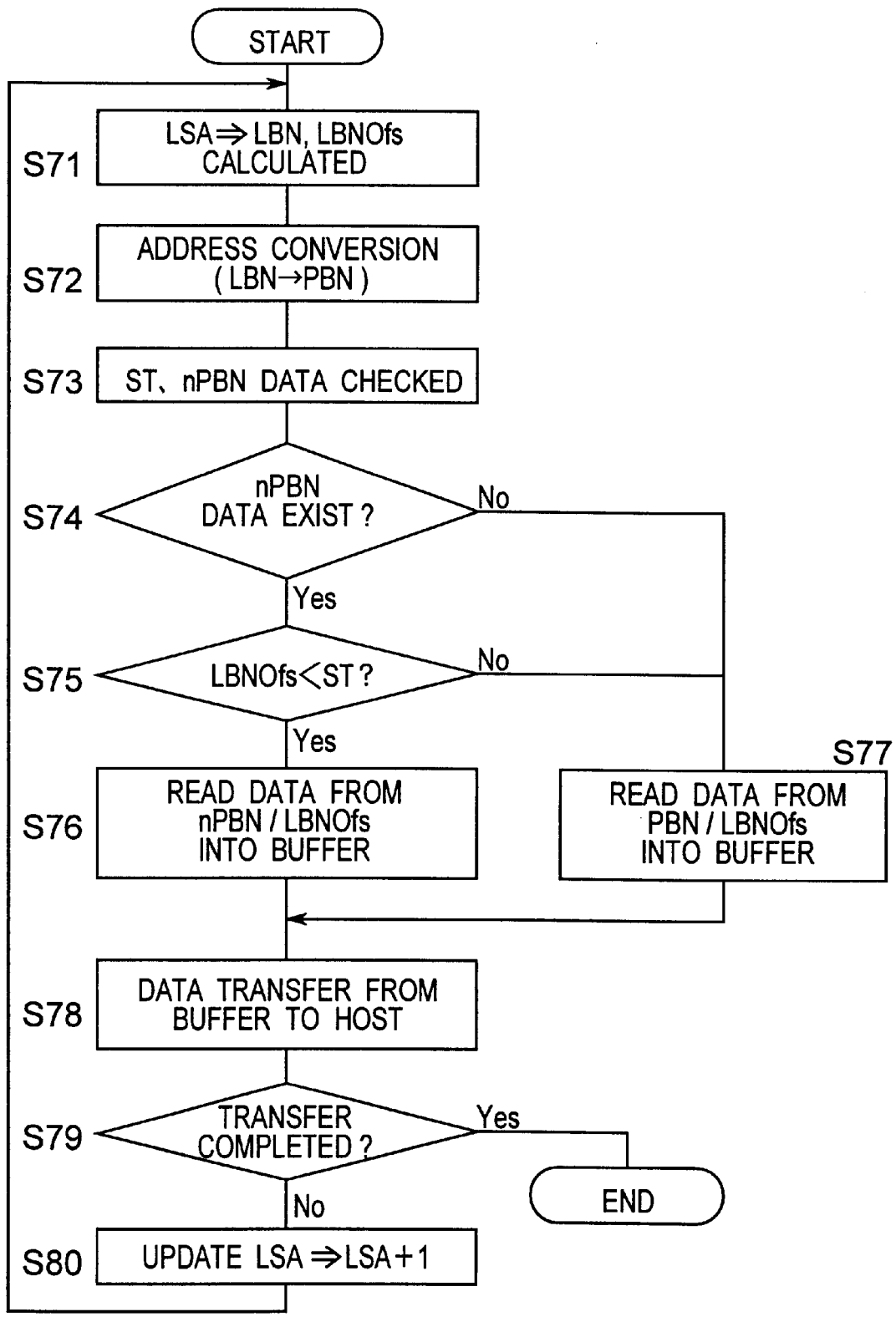

SEMICONDUCTOR MEMORY DEVICE WITH BLOCK-UNIT ERASE TYPE NONVOLATILE MEMORY

BACKGROUND OF THE INVENTION

1. Field of the Invention

The present invention generally relates to a semiconductor memory device and, more particularly, to a semiconductor memory device having a nonvolatile memory of a block-unit erase type mounted thereon such as a flash memory which can erase data in predetermined units and which can necessary and optimum data management in a data write operation.

2. Description of the Prior Art

In general, data transfer is performed in units of 512 bytes between a semiconductor memory device using a nonvolatile memory and an external information processing device such as a host computer terminal (to be referred to as a "host" hereinafter). On the other hand, in the nonvolatile memory mounted on the semiconductor memory device, data erase is performed in units of erase blocks, i.e., which are predetermined data units of several kilo bytes to several tens kilo bytes. The size of the erase block unit is considerably larger than that of the data transfer unit (512 byte).

In a semiconductor memory device in which an erase block size of the nonvolatile memory in the semiconductor memory device is not equal to a data input/output unit size required by a host, when a data write process or the like is performed, data transfer between the host and the semiconductor memory device is performed in a manner such that the host gives a read/write request (command) to the semiconductor memory device with designation of an address representing a position in a storage region for the subject data.

In a storage device using a storage medium such as a hard disk on which data can be overwritten, data is overwritten to a storage region corresponding to a received address in a magnetic disk to perform a data write process. However, data cannot be generally overwritten in a nonvolatile memory such as a flash memory for use in the semiconductor memory device. In other words, an erase operation is always required to write data. For this reason, taking account of the number of times of the erase operations being limited, a process such as an address conversion process for data management is required.

When data held in a nonvolatile memory is overwritten, an entire erase block including the data must be overwritten. In order to improve a write efficiency, the semiconductor memory device is provided with a conversion table storage unit (RAM) for storing an address conversion table. This address conversion table is used to correlate between logical sector addresses (logical sector numbers) transmitted from a host and physical sector addresses (physical sector numbers) in the nonvolatile memory.

More specifically, in a data write operation, in the case where data has been previously written in a target sector of a sector number designated by a host, an unused sector is searched, and subject data is written in the searched unused sector. In this case, since the data is written in the sector of the number different from the sector number designated by the host, the sector number (logical sector address) designated by the host must be converted into the number (physical sector number) of the searched sector in which the data is actually written. For this purpose, the address conversion table is included in the semiconductor memory device.

When data is to be overwritten in a block-unit erase type semiconductor memory device, an original erase block including the data to be overwritten is not processed, new data is written in a vacant region in a nonvolatile memory together with the data of the original erase block, and an address conversion table is overwritten to correspond to the new erase block. Thereafter, with reference to the address conversion table, a logical sector address sent from the host can be correlated to a physical sector address in the nonvolatile memory, so that the data in the nonvolatile memory can be accessed.

Conventionally, as a general known address conversion method, a method is disclosed in Japanese Unexamined Patent Laid-Open Publication No. 8-212019. In this method, a quotient obtained by dividing a logical (sector) address designated from the host by the number of sectors which can be held in one erase block in a nonvolatile memory is set as a logical block address, and a residual thereof is set as an offset. In this case, the logical (sector) address means a designated sector address transmitted from the host, and one sector is given to a block having, e.g., 512 bytes. The offset is not changed, and the logical block address (i.e., logical block number) is converted into a physical block address (i.e., erase block number) by using the address conversion table, so that data can be are managed. This address conversion method has a following advantage. That is, even though a semiconductor memory device has a large capacity, an offset is shared by sectors to make it possible to reduce data required for the address conversion table.

However, in this conventional method using such an address conversion, when continuous data is written, processes can be conveniently performed without any loss. However, when data are written in units of sectors, or when data are written at random in a plurality of erase blocks, a process time required for arranging unnecessary data becomes long, and data write rate cannot be kept constant to be a problem.

SUMMARY OF THE INVENTION

The present invention has been made to solve the above problem, and has an object to provide a semiconductor memory device having a block-unit erase type nonvolatile memory mounted thereon to perform necessary and optimum data management in a data write process and to shorten process time required for arranging unnecessary data and keep a data write rate constant even though data are written in units of sectors or data are written at random in a plurality of erase blocks.

In order to achieve the above object, a first aspect of the present invention provides a semiconductor memory device having a nonvolatile memory of which an erase block size is not equal to a data access size of a host section. The semiconductor memory device includes a CPU which calculates a quotient and a residual through dividing a logical sector address given by the host section for a data transfer by a predetermined number of sectors possibly held in one erase block. The quotient is used as a logical block number and the residual is used as an offset in a logical block.

The semiconductor memory device further includes: an address conversion table storage portion which holds an address conversion table used for converting the logical block number into an erase block number of the nonvolatile memory; and a conversion table creating unit which creates the address conversion table onto the address conversion table storage portion by dispersively storing pieces of address conversion table information in each of the erase blocks and reading out the logical block numbers from the erase blocks.

In this construction, the CPU writes data received from the host section into a vacant erase block of the erase blocks in a data writing operation, and the CPU has a storage region for storing a used address of the vacant erase block and two physical block addresses corresponding to one logical block address.

A second aspect of the present invention provides a semiconductor memory device having a nonvolatile memory portion of a block-unit erase type for sending and receiving data to and from a host section. The semiconductor memory device includes an arithmetic processing unit which entirely controls arithmetic processes of the semiconductor memory device and calculates logical block numbers from logical sector addresses given by the host section, and the nonvolatile memory portion includes a plurality of nonvolatile memories for dispersively storing data.

The semiconductor memory device further includes a conversion table storage portion which holds an address conversion table for converting the calculated logical block numbers into physical addresses serving as erase block numbers of the nonvolatile memories.

In this construction, the arithmetic processing unit obtains the logical block numbers and offsets in logical blocks by calculating quotients and residuals, respectively, through dividing the logical sector addresses by a predetermined number of sectors possibly held in one erase block. The address conversion table holds the erase block numbers of the nonvolatile memories corresponding to the calculated logical block numbers. Each of the nonvolatile memories is divided into a plurality of erase blocks, and data erase is performed in units of the erase blocks, and pieces of address conversion table information are dispersively stored in each of the erase blocks, and the arithmetic processing unit reads out the logical block numbers from the erase blocks to thereby create the address conversion table on a RAM region of the conversion table storage portion.

According to the configuration of the present invention, necessary and optimum data management can be performed in a data write process, and even though data are written in units of sectors or data are written at random in a plurality of erase blocks, process time for arranging unnecessary data can be shortened, and a data write rate can be kept constant, and the process time can be reduced.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:

FIG. 8 is a flow chart showing a data read operation of the semiconductor memory device according to the present invention.

DETAILED DESCRIPTION OF THE PREFERRED EMBODIMENTS

Embodiment 1

Figure 1:
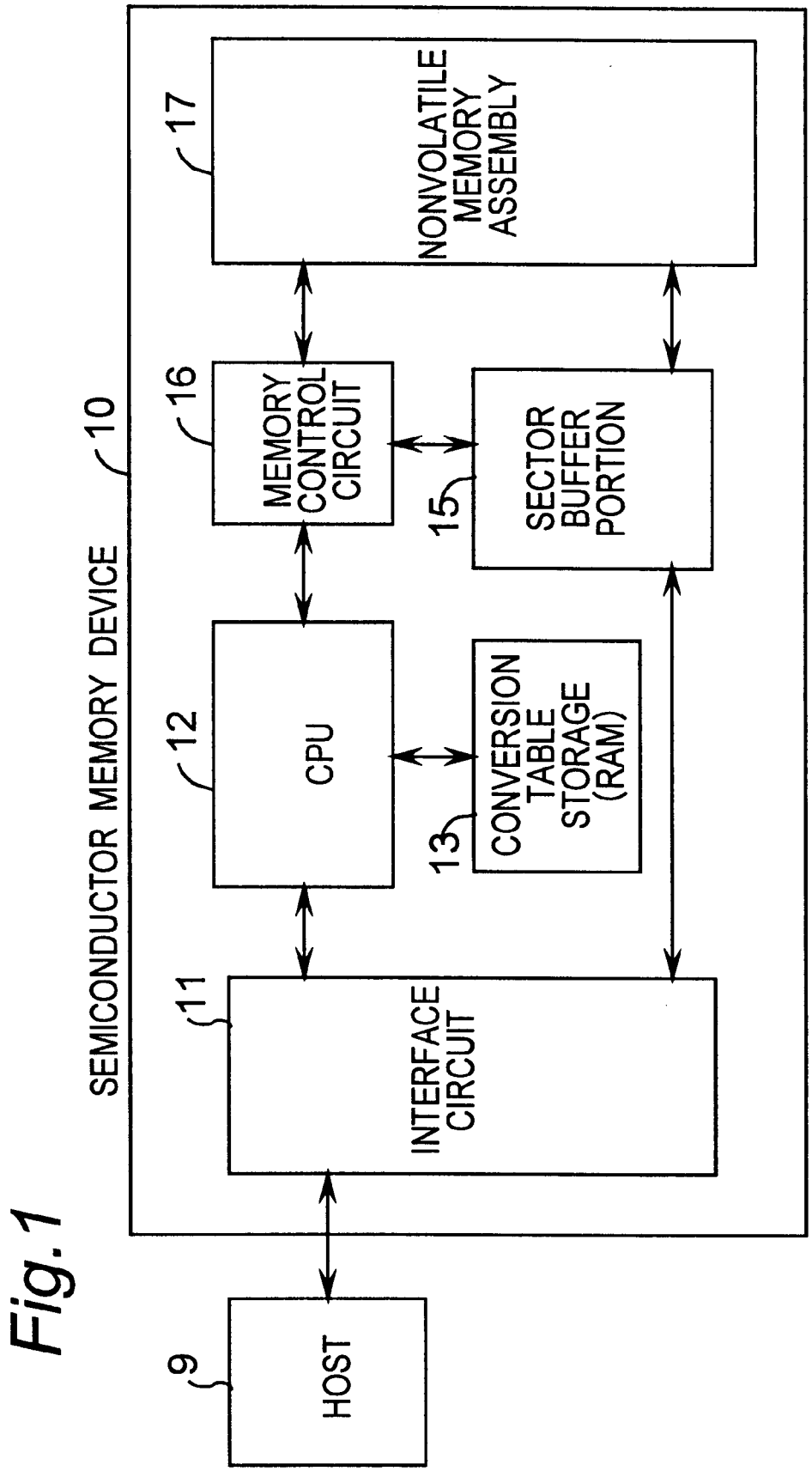
FIG. 1 is a block diagram showing the schematic configuration of a data processing system which inputs and outputs data between a semiconductor memory device according to the present invention and a host.

An embodiment of the present invention will be described below with reference to the accompanying drawings. The same reference numerals denote common elements in the respective drawings, and overlapping descriptions will be omitted.

FIG. 1 shows a schematic configuration of a data transfer process system which performs data transfer between a host 9 and a semiconductor memory device 10 having a block-unit erase type nonvolatile semiconductor memory according to Embodiment 1 of the present invention. In FIG. 1, the semiconductor memory device 10 includes an interface circuit 11, a central processing unit (CPU) 12, a conversion table storage portion 13, a sector buffer portion 15 for temporarily holding data, a memory control circuit 16, and a nonvolatile memory assembly 17 for storing data.

The interface circuit 11 inputs and outputs data with the host 9, and the central processing unit (CPU) 12 integrally controls various arithmetic processes of the entire semiconductor memory device 10. The conversion table storage portion 13 is constituted by a buffer RAM, and holds an address conversion table for converting a logical sector address designated by the host 9 into a physical sector address of the nonvolatile memory assembly 17. In the address conversion table, since data is frequently written therein and erased therefrom, the address conversion table storage portion may be constituted by an SRAM.

Figures 2, 3:
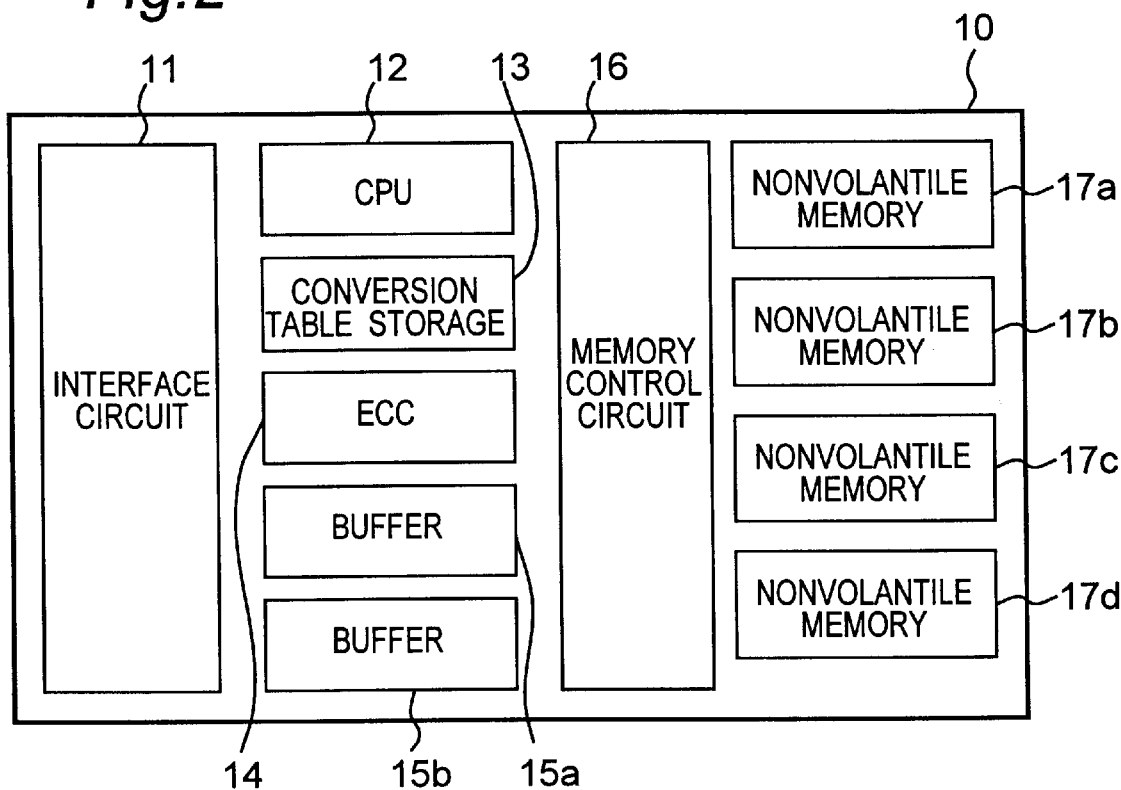
FIG. 2 is a block diagram of one embodiment of a semiconductor memory device according to the present invention.
FIG. 3 is a diagram showing an address conversion table of a semiconductor memory device according to the present invention.

FIG. 2 shows a block configuration of a preferred Embodiment 2 of the semiconductor memory device 10 having a nonvolatile semiconductor memory according to the present invention. As shown in FIG. 2, the central processing unit 12 is a central controller unit constituted by a CPU (microprocessor). The CPU 12 performs various arithmetic processes and integral control of the entire operation of the semiconductor memory device 10. The CPU 12 operates according to a program code stored in a specific region in a ROM built in the CPU or in a nonvolatile semiconductor memory. The sector buffer portion 15 is constituted by, e.g., two sector buffers 15a and 15b (which may be also referred to as "buffer memories") used to temporarily store data and to input/output data. The nonvolatile memory assembly 17 is constituted by a plurality of nonvolatile memories 17a to 17d for storing data.

In the preferred embodiment, the two sector buffers which mediate data transfer between the host terminal and the nonvolatile memory are the first and second sector buffers (15a and 15b) each having a capacity corresponding to one sector size of the nonvolatile memory. A data transfer process between the host terminal and the sector buffer and a data transfer process between the nonvolatile memory and the sector buffer may be performed by selecting different buffers of the first and second sector buffers. More specifically, when one sector buffer (e.g. 15a) gives and receives data of one sector to/from the host terminal, the other sector buffer (15b) gives and receives data of different one sector to/from the nonvolatile memory.

The memory control circuit 16 controls the nonvolatile memories 17a to 17d on the basis of an instruction from the CPU 12 to generate various control signals required to control data transfer. The sector buffers (15a, 15b) are controlled to give and receive data of one sector to/from the nonvolatile memories.

In a preferred embodiment, the control means such as a memory control circuit 16 may be controlled to apply a read/write command to a block of a nonvolatile memory in response to a command of data reading/writing sent from the host terminal, so that the control means sequentially gives and receives data between the host and the nonvolatile memory through the sector buffers every sector data. The control means may be constituted to hold a control level to the nonvolatile memory such that, after one sector data is transferred, the following sector data can be continuously transferred.

In the preferred embodiment shown in FIG. 2, an ECC circuit 14 for processing an error correction code is arranged to improve data reliability in a data transfer process. In this manner, the error correction means 14 for correcting and controlling an error of stored data may be arranged, and redundant data for error correction may also be stored immediately after respective sector data.

Referring to the error correction means, when data is read from the nonvolatile semiconductor memory 17 to the buffer 15, sector data and redundant data are transferred to the error correction means in parallel with the data reading. When an correctable error is detected, the data held on the buffer is corrected.

When data is written from the buffer to the nonvolatile semiconductor memory, sector data is transferred to the error correction means in parallel with the data writing to generate redundant data, and the generated redundant data can also be transferred to the nonvolatile semiconductor memory. In this manner, the data error correction control means is added, so that the reliability of data can be more improved.

In the above configuration, the central processing unit (CPU) 12, ECC circuit 14, and memory control circuit 16 may be integrated with each other as one control block configuration.

FIG. 3 shows details of an address conversion table held in the conversion table storage portion 13. The address conversion table includes erase block numbers (i.e., physical block addresses) PBN (PBN0, PBN1, PBN2, . . . ) of nonvolatile memories corresponding to logical block numbers LBN (LN0, LBN1, LBN2, . . . ) which are calculated by the CPU 12 on the basis of logical sector addresses LSA given by the host. Offsets PBNfs in the erase blocks are obtained from offsets LBNOfs in the logical blocks.

The logical block number LBN is a quotient (=LSA/n) obtained by dividing the logical sector address LSA by the number n of sectors which can be held in one erase block. The offset LBNOfs in the logical block is calculated by the CPU 12 as a residual (=LSA%n) obtained by dividing the logical sector address LSA by the number n of sectors mentioned above.

The address conversion table is created by the CPU 12 when a power supply of the semiconductor memory device 10 is turned on, and is held in the conversion table storage portion 13. More specifically, pieces of address conversion table information are dispersively stored in the erase blocks, respectively. When the semiconductor memory device 10 is powered on, the logical block numbers LBN required to create the address conversion table are read from the erase blocks by the CPU to structure the address conversion table on the RAM of the conversion table storage portion 13.

Figure 4A:
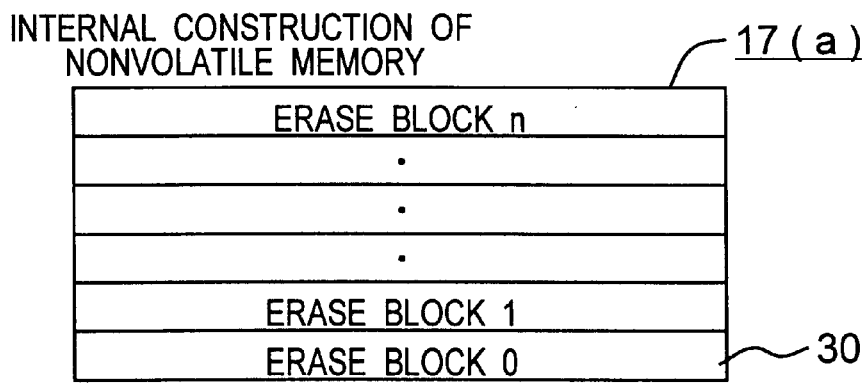
FIG. 4A is a diagram typically showing a nonvolatile memory of a semiconductor memory device according to the present invention.

FIG. 4A shows a block configuration model of each of the nonvolatile memories 17a to 17d. The internal structure of each nonvolatile memory is divided into a plurality of erase blocks 0 to n (each erase block is indicated by a reference number 30), and the data erase is performed in units of erase blocks.

Figure 4B:
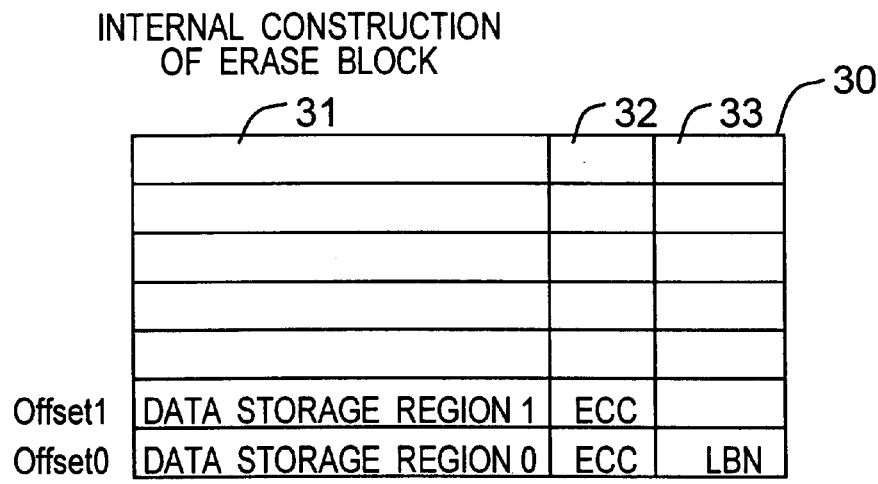
FIG. 4B is a diagram typically showing a data format in an erase block in FIG. 4A.

FIG. 4B shows a schematic configuration model of an internal data format of each of the erase blocks 30. As shown in FIG. 4B, each of the erase blocks 30 has data storage regions 31, ECC data storage regions 32, and logical block number (LBN) storage regions 33 as a plurality of combinations, respectively. The CPU 12 reads the logical block numbers LBN in the erase blocks 0 to n from the logical block number (LBN) storage regions 33, so that an address conversion table can be created. The values of the logical block numbers LBN in one erase block 30 are all equal.

Figure 5:
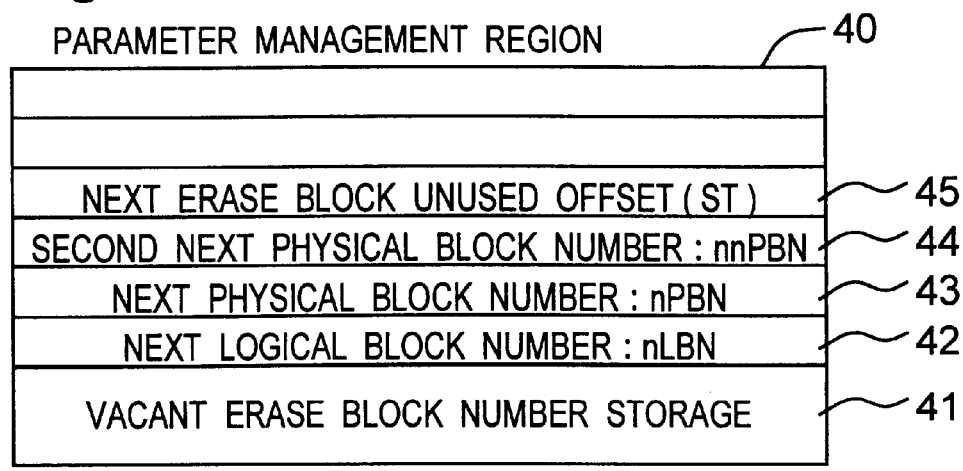
FIG. 5 is a diagram typically showing a parameter management region of the semiconductor memory device according to the present invention.

The RAM region of the CPU 12 has a parameter management region required for data management according to the present invention. FIG. 5 shows a schematic configuration model of the parameter management region 40. As shown in FIG. 5, the parameter management region 40 includes a vacant erase block number storage region 41 which stores a vacant erase block number at which no data is stored, a next logical block number (nLBN) storage region 42 which stores a logical block number corresponding to write data, a next physical block number (nPBN) storage region 43 which is used to write data, a second next physical block number (nnPBN) storage region 44 which is used when a next physical block is written with data halfway, and a next erase block unused offset (ST) storage region 45 which represents a minimum offset which is not written in the next physical block. These storage data are held in the RAM region of the CPU 12.

Figure 6:
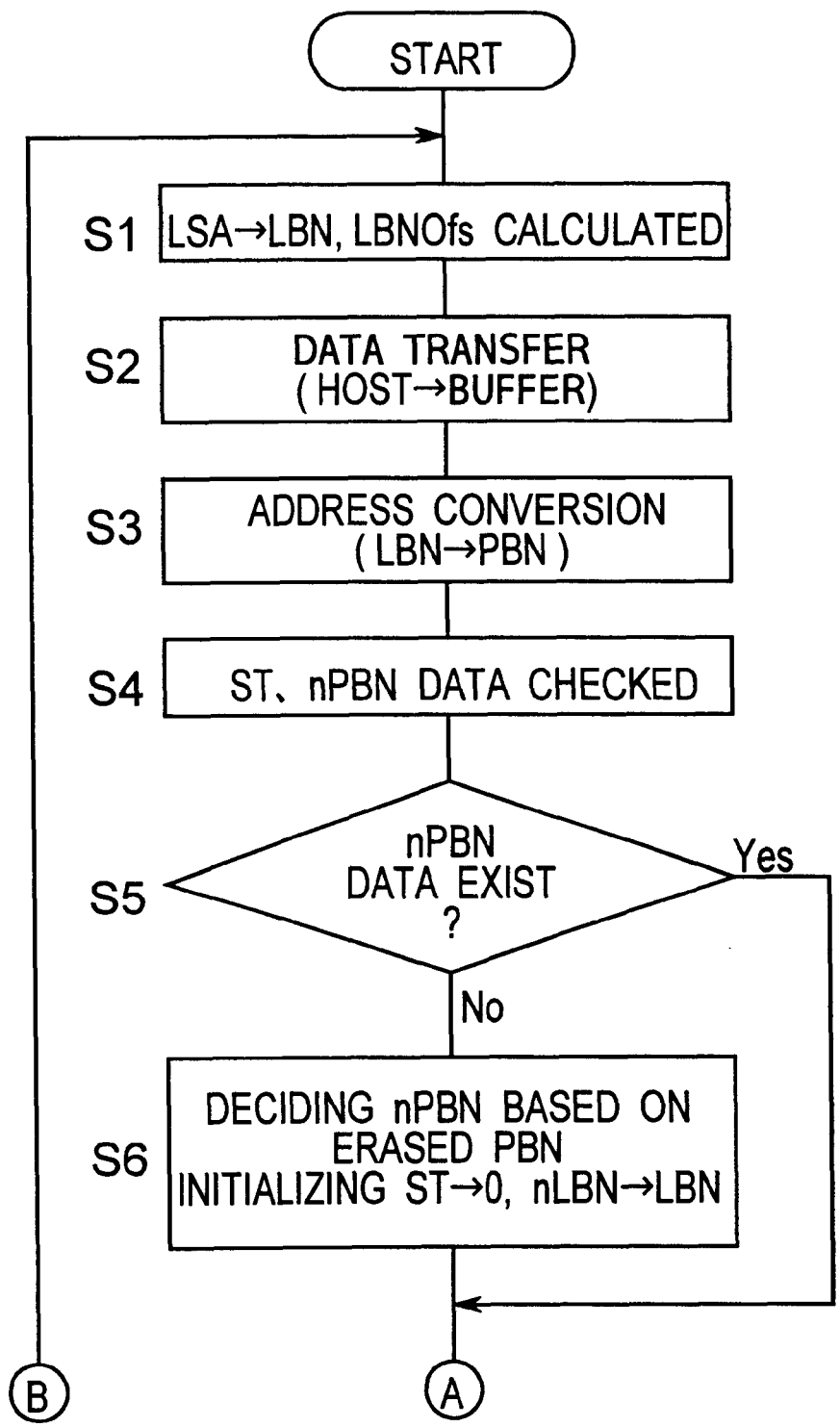
FIG. 6 is a flow chart showing a data write operation of the semiconductor memory device according to the present invention.
Figure 7:
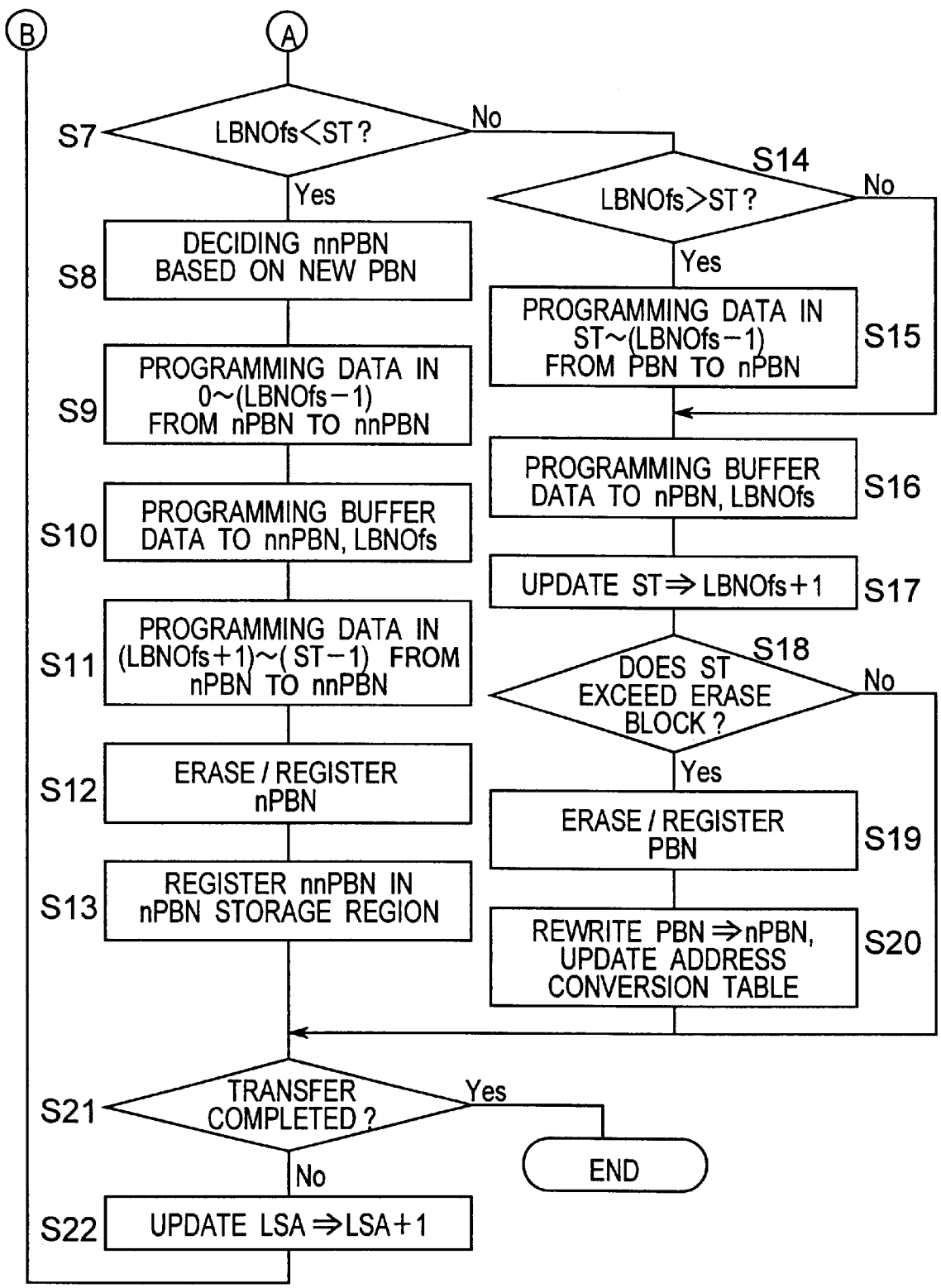
FIG. 7 is a flow chart showing a data write operation of the semiconductor memory device according to the present invention.

A procedure performed when data is written in the semiconductor memory device according to the present invention having the above configuration will be described below with reference to the flow charts shown in FIGS. 6 and 7.

At the start of the processes, an address conversion table is created by the CPU 12 to be stored in the conversion table storage portion 13 when the semiconductor memory device 10 is powered on. In step S1, a logical sector address LSA is received from the host, and a logical block number LBN and an offset LBNOfs are calculated by the CPU 12 to be obtained as the quotient and the residual of the division, respectively.

After the data is transfer from the host to the buffer portion in step S2, an erase block number PBN corresponding to the logical block number LBN is calculated by using the address conversion table in step S3. After a next erase block unused offset (ST) and a next physical block number (nPBN) are checked in step S4, it is decided in step S5 whether the next physical block number (nPBN) data exists or not.

When the physical block number (nPBN) data does not exist, an erase block number which has been erased is acquired from the vacant erase block number storage region 41 in step S6, and the acquired erase block number can be held as the next physical block number (nPBN). The next erase block unused offset (ST) is then initialized to be zero (ST=0, nLBN=LBN).

When the next physical block number (nPBN) data exist (Yes in step S5), the offset LBNOfs in the logical block and the next erase block unused offset ST are compared with each other in size in steps S7 and S14. When the offset LBNOFs in the logical block is equal to the next erase block unused offset ST (LBNOfs=ST), data received from the host are written into the next physical block number nPBN and the offset LBNOfs in the logical block in step S16 and then the next erase block unused offset ST is updated as ST= (LBNOfs+1) in step S17.

It is decided in step S18 whether the next erase block unused offset ST exceeds the range of the erase block or not. When the offset ST exceeds the range of the erase block, the erase block number PBN is erased in step S19 and registered in the vacant erase block number storage region 41. In step S20, the erase block number PBN registered in the address conversion table is rewritten by the next physical block number nPBN and the address conversion table is updated.

When it is decided in step S14 that the offset LBNOfs in the logical block is larger than the next erase block unused offset ST (LBNOfs>ST), data in the range of ST to (LBNOfs−1) is copied (programmed) from PBN to nPBN in step S15. Thereafter, the control flow shifts to step S16 to perform the same process as that performed when LBNOfs= ST.

When it is decided in step S7 that the offset LBNOfs in the logical block is smaller than the next erase block unused offset ST (LBNOfs<ST), a new erase block is secured from the vacant erase block number storage region 41 in step S8. The erase block is set as a second next physical block number (nnPBN). The data in the range of offsets 0 to (LBNOfs−1) of the erase block is copied (programmed) from nPBN to nnPBN (step S9), and buffer data is programmed in nnPBN and LBNOfs (step S10).

Data in the range of (LBNOfs+1) to (ST−1) is copied (programmed) from the block number nPBN to the block number nnPBN in step S11, and the block number nPBN is erased in step S12 and registered in the vacant erase block number storage region 41, and the nnPBN is registered in the (nPBN) storage region 43 in step S13.

Thereafter, it is decided in step S21 whether the transfer is completed or not. When the transfer is not completed, the logical sector address LSA is updated in step S22, and the control flow returns to the process in step S1.

A procedure for reading data from the semiconductor memory device according to the present invention will be described below with reference to the flow chart in FIG. 8.

The logical sector address LSA is received from the host in step S71, a logical block number LBN and an offset LBNOfs in a logical block are calculated by the CPU 12. An erase block number PBN corresponding to the logical block number LBN is calculated by using an address conversion table in step S72. After a next erase block unused offset (ST) and a next physical block number (nPBN) are checked in step S73, it is decided in step S74 whether next physical block number (nPBN) data exists or not.

When the block number nPBN data does not exist, data are read from the block number PBN and the offset LBNOfs in the nonvolatile memory into the sector buffer portion 15 according to the address conversion in step S77. When the block number nPBN exists, it is decided in step S75 whether the offset LBNOfs in the logical block is smaller than the next erase block unused offset ST. When the offset LBNOfs is larger than the offset ST, the control flow shifts to the process in step S77.

When the offset LBNOfs is smaller than the offset ST, the process of reading data from the block number and the offset LBNOfs in the nonvolatile memory is continued in step S76. Data transfer from the buffer unit to the host is performed in step S78, and it is checked in step S79 whether the transfer is completed or not. When the transfer is not completed, the logical sector address LSA is updated in step S80, the control flow returns to the process in step S71.

These processes are performed, so that a semiconductor memory device having stable performance can be achieved.

As described above, according to the present invention, there can be provided a semiconductor memory device having a block-unit erase type nonvolatile memory which can perform necessary and optimum data management in a data write process. In addition, even though data are written in units of sectors or data are written at random in a plurality of erase blocks, process time for arranging unnecessary data can be reduced, and a data write rate can be kept constant. An improvement in reliability of data can be achieved by error correction without deteriorating the above advantages.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor memory device having a nonvolatile memory portion of a block-unit erase type for sending and receiving data to and from a host section, the semiconductor memory device comprising:

an arithmetic processing unit which entirely controls arithmetic processes of the semiconductor memory device and calculates logical block numbers from logical sector addresses given by the host section;

the nonvolatile memory portion including a plurality of nonvolatile memories for dispersively storing data; and a conversion table storage portion which holds an address conversion table for converting the calculated logical block numbers into physical addresses serving as erase block numbers of the nonvolatile memories, wherein the arithmetic processing unit obtains the logical block numbers and offsets in logical blocks by calculating quotients and residuals, respectively, through dividing the logical sector addresses by a predetermined number of sectors possibly held in one erase block, wherein the address conversion table holds the erase block numbers of the nonvolatile memories corresponding to the calculated logical block numbers, wherein each of the nonvolatile memories is divided into a plurality of erase blocks, and data erase is performed in units of the erase blocks, and wherein pieces of address conversion table information are dispersively stored in each of the erase blocks, and the arithmetic processing unit reads out the logical block numbers from the erase blocks to thereby create the address conversion table on a RAM region of the conversion table storage portion.

2. The semiconductor memory device according to claim 1, wherein each of the erase blocks of the nonvolatile memories includes data storage regions and logical block number storage regions as a plurality of combination pairs, and the arithmetic processing unit reads out the logical block numbers from the logical block number storage regions of the entire erase blocks to create the address conversion table.

3. The semiconductor memory device according to claim 1, wherein a RAM region of the arithmetic process unit has a parameter management region for data management which includes a vacant erase block number storage region for storing a vacant erase block number allocated with no data stored, a next logical block number storage region for storing a logical block number corresponding to write data, a next physical block number storage region for storing a next physical block number which is used to write data, a second next physical block number storage region for storing a second next physical block number which is used when a next physical block is written with data halfway, and a next erase block unused offset storage region for storing a next erase block unused offset which represents a minimum offset which is not written in the next physical block.

* * * * *